United States Patent [19]
Frei et al.

[11] Patent Number: 5,345,056
[45] Date of Patent: Sep. 6, 1994

[54] PLASMA BASED SOLDERING BY INDIRECT HEATING

[75] Inventors: John K. Frei, Mesa; Russell T. Fiorenzo, Scottsdale, both of Ariz.

[73] Assignee: Motorola, Inc., Schaumburg, Ill.

[21] Appl. No.: 805,746

[22] Filed: Dec. 12, 1991

[51] Int. Cl.$^5$ .............................................. B23K 9/00
[52] U.S. Cl. ........................ 219/121.59; 219/121.43; 219/121.44; 219/85.1; 219/85.22; 228/180.22
[58] Field of Search ...................... 219/121.43, 121.44, 219/121.52, 85.1, 85.22; 228/180.2; 427/432, 434

[56] References Cited
U.S. PATENT DOCUMENTS

| | | | |
|---|---|---|---|
| 4,752,027 | 6/1988 | Gschwend | 228/180 |
| 4,830,264 | 5/1989 | Biraillou et al. | 228/180 |
| 4,921,157 | 5/1990 | Dishon et al. | 228/124 |
| 4,940,181 | 7/1990 | Juskey, Jr. et al. | 228/180.2 |

FOREIGN PATENT DOCUMENTS
293952 11/1988 Japan .
1177097 7/1985 U.S.S.R. .

*Primary Examiner*—Mark H. Paschall
*Attorney, Agent, or Firm*—Frederick M. Fliegel

[57] ABSTRACT

A method of soldering without the use of flux, wherein a plurality of solder bumps are deposited on a first surface and a plurality of solder pad locations are prepared on a second surface. The first and second surfaces are placed immediately adjacent to one another, placing each the plurality of solder bumps in the proximity of a corresponding solder pad location on the second surface. The first surface, the second surface and the solder are placed in a chamber which is evacuated to a low pressure. A plasma is excited within the chamber which heats the first and the second surfaces, thereby heating the plurality of solder bumps and the plurality of solder pad locations by heat conduction and reflowing the plurality of solder bumps on the first surface and on the plurality of solder pad locations on the second surface to form a plurality of solder bonds therebetween.

24 Claims, 3 Drawing Sheets

PLASMA BASED SOLDERING BY INDIRECT HEATING

CROSS-REFERENCE TO RELATED APPLICATION

This application is related to co-pending patent application Ser. No. 709,673, filed on Jun. 3, 1991 and which is assigned to the same assignee as the present application.

FIELD OF THE INVENTION

This invention relates in general to the field of soldering and in particular to soldering using plasmas.

BACKGROUND OF THE INVENTION

Soldering involves the physical and electrical connection of components or devices using a low melting point alloy. Examples of suitable alloys include tin-lead (approximately 60% –40% by weight) solder having a melting point of approximately 178 degrees Celsius (°C.) and indium-lead (70% –30% by weight) solder having a liquidus temperature of approximately 174° C., as well as many others. Such solders may be used to solder particular materials, for example, the indium-lead solder mentioned above is useful for soldering gold or gold plated components which are chemically and/or metallurgically attacked by tin-lead solders. Such gold or gold plated components may comprise gold bearing alloys such as, by way of example, eutectic alloys of gold-tin, gold-germanium, gold-silicon and other gold bearing materials as are well known in the art.

Soldering processes involve the basic steps of cleaning and de-oxidizing, solder reflowing and flux residue removal. Cleaning and de-oxidizing are usually accomplished by applying a flux material to remove contaminants and oxides from the surfaces to be soldered. Oxides typically have higher melting points than solder alloys and may form an insoluble barrier, preventing wetting of the surfaces to be soldered if the oxides are not removed prior to the solder reflowing. Solder reflowing joins the surfaces to be soldered when the solder is heated above its melting point. Residue removal involves stripping of flux residues left from the cleaning and de-oxidizing step and this becomes more difficult as the physical size of components to be soldered decreases. This is because it is more difficult for the residue cleaning agents to penetrate small gaps between the components and the substrate.

Hand soldering involves soldering each solder joint by hand, one at a time. This method also requires use of flux during soldering and subsequent flux removal after soldering. In hand soldering, components are subjected to localized heating which may affect the material in the component or substrate, depending on the time and temperature required in order to make the solder joint. The substrate and component are each subjected to a high temperature in a localized area. Because of the thermal mass of the component or area being soldered, the material in the area being soldered generally must be heated 20°–40° C. above the solder melting temperature, increasing the potential for damage. Hand soldering is labor intensive inasmuch as each soldered connection must be made sequentially. These limitations have led to intense development of alternative methods wherein multiple solder connections are effected by a single operation.

Examples of such methods include both wave soldering and vapor phase soldering. These techniques may be used to heat the solder (and the substrate on which the components are to be mounted) to the melting or the liquidus temperature of the solder. Both methods heat all components and the substrate to the soldering temperature and also require use of a flux. Thus, all components must be capable of withstanding the soldering temperatures and cannot be affected by either the flux or the cleaning solutions utilized to remove flux residues.

The cleaning solutions employed for flux removal pose environmental hazards on use and on disposal, may pose health hazards for workers, and may necessitate expensive apparatus for their use and for exhaust and effluent scrubbing. A further issue which use of some solvent cleaning methods raise is that of minimizing the risk of fire due to presence of flammable solvent vapors.

Another disadvantage of soldering methods wherein fluxes are included is that complete removal of residues from the flux is not possible. As a result of this, standards for specifying post-soldering flux criteria are directed to determining residual concentrations of flux which are acceptable for a given application.

Several fluxless soldering processes have been developed to replace the pre-soldering cleaning step and to eliminate need for post-soldering flux residue removal and the attendant need for and risks associated with solvent use. Among these processes are sputtering, fluorinated gas plasma use and use of oxygen and pure nitrogen plasmas. Sputtering is limited in accuracy and penetrates for only short distances. Also, sputtering may damage the substrates and components.

Fluorinated gas plasmas attack certain materials (e.g., glasses) and require exhaust scrubbing systems in order to meet environmental regulations. Oxygen plasmas are useable with gold eutectic solder alloys, but badly oxidize tin-lead solder. Pure nitrogen plasmas do not generally provide sufficient fluxing action to allow tin-lead solder to wet either the substrate or the components to be soldered. Also, solder reflow in fluorinated gas, oxygen or nitrogen plasmas is typically accomplished by conventional heat application from a heat source other than from the plasma itself (e.g., infrared heat sources, laser heating, et cetera).

An additional series of problems are encountered in attempting to solder a two-dimensional array of solder connections captive between two planar surfaces which are in close proximity to one another. There is difficulty in removing flux from between two planar, closely spaced surfaces. A further difficulty occurs in inspecting for complete flux removal after soldering without destructive physical analysis.

What is needed is a method for fluxless soldering obviating post-soldering flux removal, which does not require direct contact between the plasma and the surfaces to be solder joined, allowing solder connections to be formed which are shielded from the plasma. What is further needed is a method for fluxless soldering which does not pose environmental concerns, which allows a plurality of solder joints to be simultaneously established and which will not attack the components being soldered.

SUMMARY OF THE INVENTION

Accordingly, it is an advantage of the present invention to provide a new and improved apparatus and method for plasma based soldering. It is a further advantage of the present invention to provide a method to reactively reduce oxides, not only on the solder itself, but also on the surfaces onto which the solder is to be reflowed, to leave no contaminating compound on the surfaces to be absorbed into the solder during reflow. It is still a further advantage of the present invention to provide a method for employing a plasma to provide the heat necessary to take the solder above its melting point, without using other heat sources.

To achieve these advantages, a plasma based soldering method and apparatus fabricated thereby are contemplated which do not require the use of flux and which do not require heat sources other than the excited plasma. The apparatus is fabricated by the method, which comprises depositing solder at one of two immediately adjacent surfaces of components which are to be solder bonded together. The surfaces to be soldered are placed in a chamber which is evacuated to a low pressure. A plasma is provided in the chamber and excited to cause cleaning of the surfaces and the solder. The excited plasma causes heating of the surfaces of the components. The components, in turn, heat the solder by conduction, causing the solder to reflow on the surfaces to form a high integrity solder bond.

The above and other features and advantages of the present invention will be better understood from the following detailed description taken in conjunction with the accompanying drawings.

DETAILED DESCRIPTION OF THE DRAWINGS

Plasma processing has been used extensively in the semiconductor industry for growth of thin-film materials and for dry etching. A plasma is able to generate chemically active species at low temperatures because a plasma is a non-equilibrium state of matter. The temperature or thermal energy of the plasma (e.g., kinetic energy of the atoms, ions, radicals, et cetera, comprising the plasma) is generally near ambient. The electron energy (not thermal energy) is quite high, however, and may break molecular bonds, creating ionic species and radicals. One feature of a plasma is that chemical reactions ordinarily occurring only at high temperatures may be made to occur at markedly lower temperatures in the presence of a plasma.

Figure 1:
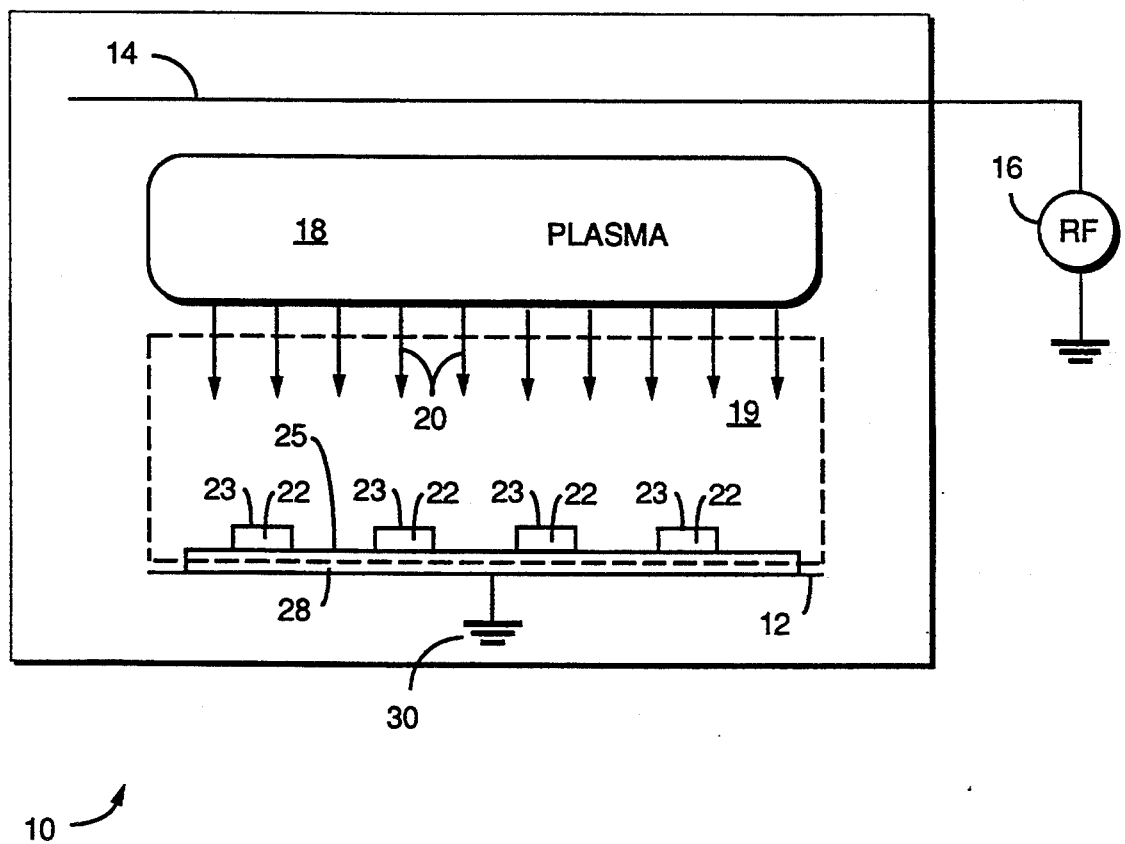
FIG. 1 is a schematic diagram of a plasma based soldering apparatus in accordance with a preferred embodiment of the invention.

In FIG. 1, there is shown a schematic diagram of a planar plasma based soldering apparatus comprising plasma chamber 10, RF source 16 and external ground 30. Plasma chamber 10 comprises first electrode 14, second electrode 12, plasma 18, plasma sheath 19 and plasma species 20. Within plasma chamber 10 are shown components 22 having surfaces 23 and substrate 28 having surface 25.

Components 22 may comprise any electronic component having a substantially planar array of solderable regions for the purpose of establishing electrical connections. Examples of commonly used electronic parts of this type include flip-chips, beam lead devices, pad array carriers and the like, as is well known in the art.

Either a barrel (tube) or planar plasma chamber or reactor may be used, and plasma 18 may be generated by several means. Examples include radio frequency (RF) or direct current excitation of gasses within plasma chamber 10. In accordance with a preferred embodiment of the invention, a planar plasma RF apparatus is described, with RF source 16 connected between first electrode 14 and electrical ground 30. An example of a barrel plasma RF apparatus employed in another preferred embodiment of the present invention is the PM-600 plasma system available from March Instruments of Concord, Calif.

FIG. 1 shows second electrode 12 opposite first electrode 14 in plasma chamber 10 and second electrode 12 connected to electrical ground 30. RF source 16 may be a 500 Watt peak RF power generator operating at 13.56 MegaHertz. RF source 16 may be located outside of plasma chamber 10, while first electrode 14, second electrode 12, plasma 18, components 22 and substrate 28 are located within plasma chamber 10.

RF source 16 excites plasma 18, contained in the volume between first electrode 14 and second electrode 12. RF source 16 creates a changing electromagnetic field in the region between first electrode 14 and second electrode 12, causing ionization of the plasma gasses and an increase in kinetic energy in plasma species 20. Plasma species 20 comprises ions, radicals (unstable neutral atoms or atom groups) and molecules.

The interior of plasma chamber 10 may be at a pressure of approximately 127 Pascal, i.e. about 0.95 Torr. A standard mechanical pump is capable of maintaining this vacuum, without requiring special vacuum pumps such as cryopumps, diffusion pumps or turbomolecular pumps.

Plasma 18 may comprise forming gas, a gas mixture containing approximately 10% hydrogen and 90% nitrogen. The mixture should contain more than 5% hydrogen in order to be able to reduce surface oxides and so to enable solder to wet substrate 28 and/or components 22. While increased concentrations of hydrogen also enable solder wetting, the use of pure hydrogen gas or high hydrogen concentrations in inert carrier gasses creates a safety concern as these are explosive when used in conjunction with an oxygen ambient. Special equipment, such as alarms and burn-off apparatus, are required for use of pure hydrogen gas or gas mixtures having large percentages of hydrogen therein. Mixtures of hydrogen and nitrogen are flammable at hydrogen concentrations above 15%. The use of forming gas with 10% hydrogen and 90% nitrogen requires no special safety precautions. Similarly, no fluorinated gas is used to form the plasma. A further potential problem for fluorinated gasses is that, if plasma chamber 10 uses a glass lining, this may be damaged by extensive use of a fluorinated gas plasma.

RF source 16 excites plasma 18, creating energetic plasma species 20 in the zone of plasma sheath 19 enveloping components 22. Plasma species 20 impinge on components 22. Components 22 are mounted on substrate 28, which is located adjacent to second electrode 12, between first electrode 14 and second electrode 12.

In operation, plasma species 20 are not reactive enough to perform etching except on some materials such as photoresist. Surfaces 23 and 25 of components 22 and substrate 28, respectively, exposed to impinging plasma species 20, absorb impinging plasma species 20 which react with impurities on surfaces 23 and 25 and reaction products desorb therefrom. Surfaces 23 and 25, cleaned by impinging plasma species 20, are thereby raised in surface energy, resulting in a reduced wetting angle for good continuous uniform solder flow during solder reflowing.

Figure 2:
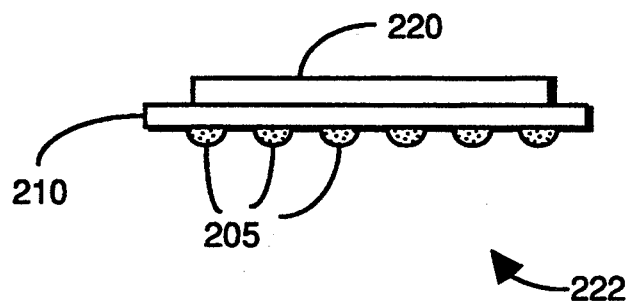
FIG. 2 is a simplified side view of a pad array carrier with solder bumps.

FIG. 2 is a simplified side view of pad array carrier 222 having solder bumps 205. Pad array carrier 222 comprises lid 220 with base 210, having solder bumps 205 attached to base 210. Solder bumps 205 may comprise solder masses deposited by screen printing, sputtering, plating or other processes well known in the art and may, by way of example, have an average diameter of 0.036 inch on 0.050 inch centers. Solder bumps 205 may comprise tin-lead, gold-bearing (e.g., In-Au) or other solder alloys, as is well known in the art.

Figure 3:
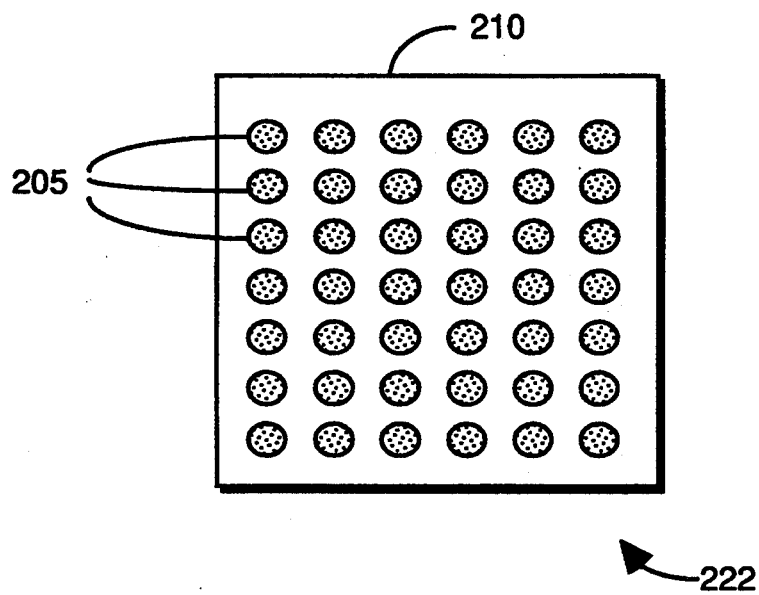
FIG. 3 is a simplified bottom view of the pad array carrier and solder bumps of FIG. 2.

FIG. 3 is a simplified bottom view of pad array carrier 222 and solder bumps 205 of FIG. 2. Solder bumps 205 are shown attached to base 210. Pad array carrier 222 illustrated in FIGS. 2 and 3 is one example of component 22 of FIG. 1.

Lid 220 (FIG. 2) and base 210 (FIGS. 2 and 3) may comprise ceramic materials such as alumina, bonded together, for example, by a glass seal. Pad array carrier 222 may house, by way of example, a hybrid circuit and/or a medium, large (LSI) or very large (VLSI) scale silicon integrated circuit, together with on the order of fifty to several hundred or more interconnections effected via solder bumps 205. Pad array carrier 222 thus comprises an efficient means for housing and interconnecting integrated circuit components having large numbers of external interconnections, such as, by way of example, LSI and VLSI integrated circuits, which may perform digital or analog circuit functions or a mixture thereof. Such pad array carriers and other similar articles are produced by a variety of electronics products manufacturers, including by way of example, International Business Machines Corporation, the Corporate Manufacturing Research Center of Motorola, Incorporated, of Chicago, Ill. and Kyocera of Japan.

Figure 4:
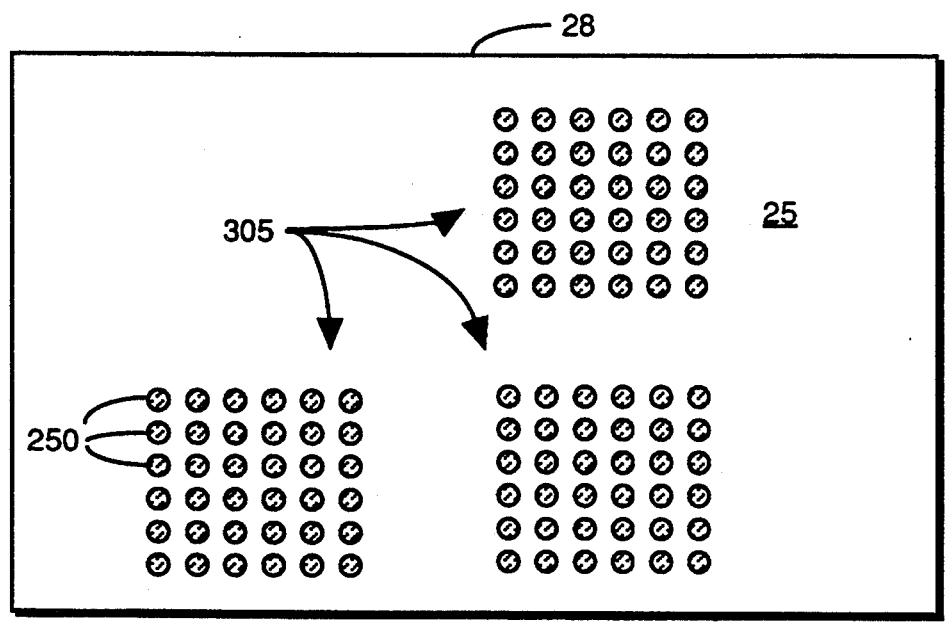
FIG. 4 is a simplified top view of a substrate with solder pad locations.

FIG. 4 is a simplified top view of substrate 28 having surface 25 showing solder pad locations 250 arranged in three groups 305 of thirty six solder pad locations 250 per group 305 disposed on surface 25. Groups 305 comprise thirty six solder pad locations 250 for purposes of illustration only. In practice, any number of solder pad locations 250 arranged in any convenient manner may comprise a group 305. By way of example, substrate 28 may comprise fiberglass-epoxy printed circuit board material, ceramic substrate material or other substrate materials as are well known in the art.

The plurality of solder pad locations 250 comprise metallized traces bonded to surface 25 of substrate 28. The solder pad locations 250 may have been treated to facilitate soldering. Tin plating is an example of such treatment for use with tin-lead solders, while plating with gold or gold-bearing alloys is an example of surface preparation suitable for soldering with indium-lead or other appropriate solder materials. Other surface preparations suitable for a variety of different applications are well known in the art.

Figure 5:
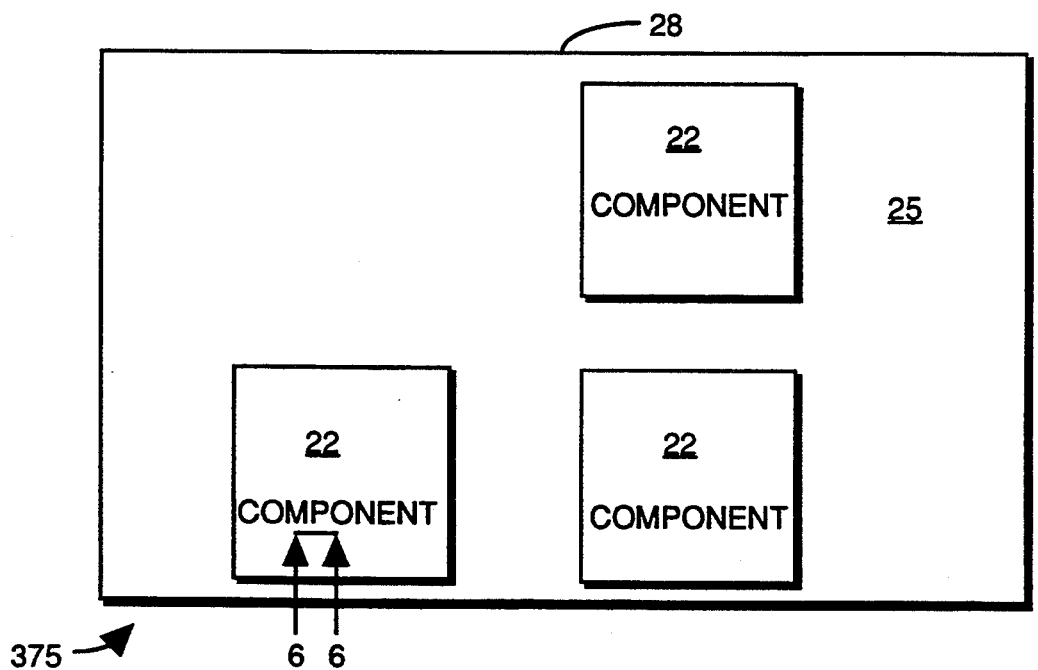
FIG. 5 is a simplified top view of a substrate having components soldered thereto.

FIG. 5 is a simplified top view of substrate 28 and surface 25. Surface 25 has a plurality of components 22 soldered thereto to form electronic assembly 375. While three components 22 are shown attached to substrate 28 for purposes of illustration, any number of components 22 and other parts may be included in electronic assembly 375.

Figure 6:
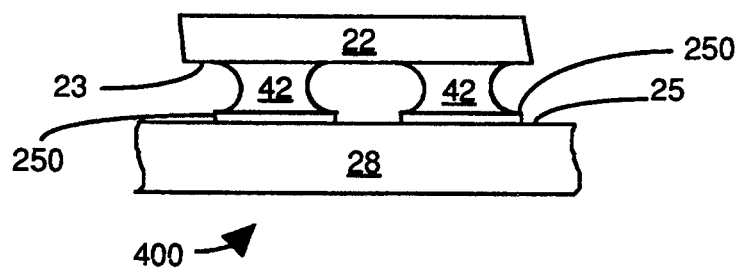
FIG. 6 is an enlarged side view, in section, taken along section lines 6—6' of FIG. 5, of a portion of an electronic assembly comprising a component and a substrate.

FIG. 6 is an enlarged side view, in section, taken along section lines 6—6' of FIG. 5, of a portion 400 of electronic assembly 375 of FIG. 5. Portion 400 comprises component 22 having a first surface 23 and substrate 28 having a second surface 25. After soldering, solder connections 42 and solder pad locations 250 join component 22 to substrate 28 as shown in FIG. 6. After solder reflowing, high integrity solder bonds 42 are formed. Solder bonds 42 may form concave edges (as illustrated) or convex edges, depending upon the conditions under which soldering takes place.

The time required for the plasma-based soldering procedure may range from less than fifteen minutes to thirty minutes or longer. This time depends on a variety of factors including the power applied to plasma 18, the pressure within plasma chamber 10, the thermal conductivity of substrate 28, the liquidus temperature of the particular solder composition employed, and the hydrogen concentration used in the gasses comprising plasma 18. This time also depends in part on the thermal mass and the thermal conductivity of the work being soldered (e.g., component 22 of FIGS. 1 and 5) and on the number of pieces of work in plasma chamber 10.

A time on the order of one minute is required to evacuate plasma chamber 10. Approximately ten to twenty minutes may be required to energize plasma species 20 to the point where cleaning and heating of surfaces 23 and 25 occurs. Heating of surface 23 of component 22 and of surface 25 of substrate 28 results in heating of solder bumps 205 (FIGS. 2 and 3) and solder pad locations 250 (FIG. 4).

Heating by conduction through the body of component 22 and through substrate 28 proceeds until solder bumps 205 melt and thoroughly wet solder pad locations 250, completing solder reflow and electrically and physically interconnecting component 22 and substrate 28. This forms electronic assembly 375 (FIG. 5) from component 22 and substrate 28.

A time on the order of one minute is required to vent plasma chamber 10 to atmospheric pressure and to cool components 22 and substrate 28. The venting of plasma chamber 10 contributes to the cooling of components 22 and substrate 28 because the gasses being admitted to plasma chamber 10 are expanding greatly and so experience a decrease in temperature on being admitted into plasma chamber 10 and put into contact with components 22 and substrate 28.

Soldering quality is strongly influenced by wetting angle which in turn depends critically on the cleanliness of the surfaces being soldered. By cleaning surfaces 23 and 25 of FIG. 1 and de-oxidizing solder bumps 205 of FIGS. 2 and 3 and solder pad locations 250 of FIG. 4 at the same time soldering is performed, the need for flux is eliminated.

A plasma based soldering method, apparatus and electronic assembly formed thereby have been described which overcome specific problems and accomplish certain advantages relative to prior art methods and mechanisms. The improvements over known technology are significant and include those advantages and features which are enumerated below.

First, no flux is required for soldering, and thus no post-soldering removal of flux residues is required. High quality, reliable solder connections result. Second, cleaning and de-oxidizing is performed at the same time and with the same materials as soldering, minimizing processing steps and complexity. Third, components which cannot withstand cleaning of residual flux may be soldered with this method. The technique described herein is thus suitable for use where chemical sensitivity would otherwise be a problem. Fourth, no independent heat source (such as infrared, laser, et cetera) is required. Fifth, since the plasma is the source of heating, thermal overshoot is not likely as heating stops once the plasma excitation is turned off. Sixth, no special cooling mechanisms or high vacuum systems are required, again promoting simplicity and reliability. Seventh, a plurality of solder joints may be soldered simultaneously, resulting in increased efficiency and so reducing soldering costs by employment of a relatively inexpensive system suitable even for table top use. Eighth, both interconnections not directly exposed to the plasma as well as those interconnections which are directly heated by the plasma are readily soldered, allowing dense two-dimensional arrays of soldered contacts to be formed simultaneously without use of flux. Ninth, no environmentally hazardous solvents or gasses are needed for the soldering procedure, reducing facilities costs and waste disposal issues. Tenth, no flux residues remain on or in the electronic assembly thus formed.

Thus, there has also been provided, in accordance with an embodiment of the invention, a plasma based soldering method and apparatus suitable for soldering both interconnections which are shielded from being directly heated by the plasma and those interconnections directly exposed thereto, as well as an electronic assembly fabricated thereby, that fully satisfies the aims and advantages and which incorporates the desirable features set forth above.

While the invention has been described in conjunction with a specific embodiment, many alternatives, modifications and variations will be apparent to those of ordinary skill in the art in light of the foregoing description. Accordingly, the invention is intended to embrace all such alternatives, modifications and variations as fall within the spirit and broad scope of the appended claims.

What is claimed is:

1. A method of soldering by conduction of heat from a plasma, comprising the steps of:
   depositing a plurality of solder bumps on a first surface;
   preparing a plurality of solder pad locations on a second surface;
   putting the first and the second surfaces in contact with one another, such that each one of the plurality of solder bumps contacts a corresponding one of the plurality of solder pad locations on the second surface, at least one of the plurality of solder bumps and corresponding ones of the plurality of solder pad locations being shielded from direct contact with the plasma;
   placing the first surface including solder bumps and the second surface including solder pad locations in a chamber;
   evacuating the chamber to a low pressure;
   providing the plasma gas within the chamber;
   exciting the plasma gas to provide a plasma;
   heating the first and the second surfaces with the plasma;
   heating the plurality of solder bumps and the plurality of solder pad locations by heat conduction from the first and the second surfaces; and
   reflowing the plurality of solder bumps on the first surface onto the plurality of solder pad locations on the second surface to form a plurality of solder bonds between the first and the second surfaces.

2. A method of soldering as claimed in claim 1, wherein said preparing step includes the step of plating a metal on each of the plurality of solder pad locations on the second surface.

3. A method of soldering as claimed in claim 1, wherein said evacuating step comprises the step of vacuum pumping the chamber to an absolute pressure of approximately 125 Pascal (approximately one Torr).

4. A method of soldering as claimed in claim 1, wherein said providing step comprises the step of providing a forming gas mixture of hydrogen gas and nitrogen gas in the chamber.

5. A method of soldering as claimed in claim 1, wherein said providing step comprises the steps of:
   providing a hydrogen gas and nitrogen gas mixture in the chamber; and
   providing a hydrogen gas concentration in a range of 5% to 15% of the hydrogen gas and nitrogen gas mixture.

6. A method of soldering as claimed in claim 1, wherein said exciting step comprises the step of energizing the plasma between a first electrode and a second electrode by applying a radio frequency (RF) energy source connected across the first electrode and the second electrode, said energizing step producing an excited plasma species.

7. A method of soldering as claimed in claim 6, wherein said energizing step occurs for a time period in a range of approximately 10 to 20 minutes.

8. A method of soldering as claimed in claim 2, wherein said depositing step comprises the step of depositing tin-lead solder bumps.

9. A method of soldering as claimed in claim 8, wherein said plating step comprises the step of tin plating the plurality of solder pad locations.

10. A method of soldering as claimed in claim 9, wherein said reflowing step occurs at a solder temperature in the range of approximately 178 degrees Celsius to 210 degrees Celsius.

11. A method of soldering as claimed in claim 2, wherein said depositing step comprises the step of depositing indium-lead solder bumps.

12. A method of soldering as claimed in claim 11, and wherein said plating step comprises the step of plating the plurality of solder pad locations with gold bearing material.

13. A method of soldering as claimed in claim 12, wherein said reflowing step occurs at a solder temperature in the range of approximately 174 degrees Celsius to 206 degrees Celsius.

14. A method of physically and electrically bonding an electronic device to a circuit board to form an electronic assembly by plasma soldering, said method comprising the steps of:
   depositing a plurality of solder bumps on a first surface of the electronic device to form a solder bumped device;
   plating a metal on a plurality of solder pad locations on a second surface on the circuit board;

putting the electronic device and the circuit board in contact with one another, such that each one of the plurality of solder bumps contacts a corresponding one of the plurality of solder pad locations on the circuit board;

placing the electronic device including solder bumps and the circuit board including solder pad locations in a chamber;

evacuating the chamber to an absolute pressure of approximately 125 Pascal (approximately one Torr);

providing a hydrogen gas and nitrogen gas mixture in the chamber;

exciting the hydrogen and nitrogen gas mixture to form a plasma;

heating the electronic device and the circuit board with the plasma;

heating the plurality of solder bumps and the plurality of solder pad locations by heat conduction from the electronic device and the circuit board; and reflowing the plurality of solder bumps on the electronic device onto the plurality of solder pad locations on the circuit board to form a plurality of solder bonds between the electronic device and the circuit board, physically and electrically bonding the electronic device to the circuit board to form an electronic assembly.

15. A method as claimed in claim 14, wherein said putting step includes the step of shielding at least one of the plurality of solder bumps and at least corresponding ones of the solder pad locations from direct contact with the plasma.

16. A method as claimed in claim 14, wherein said exciting step comprises the step of energizing the plasma between a first electrode and a second electrode by applying a radio frequency (RF) energy source connected across the first electrode and the second electrode, said step of energizing the plasma producing an excited plasma species.

17. A method as claimed in claim 16, wherein said energizing step occurs for a time period in a range of approximately 10 to 20 minutes.

18. A method as claimed in claim 14, wherein said depositing step comprises the step of depositing tin-lead solder bumps.

19. A method as claimed in claim 18, wherein said plating step comprises the step of tin plating the plurality of solder pad locations.

20. A method as claimed in claim 19, wherein said reflowing step occurs at a solder temperature in the range of approximately 178 degrees Celsius to 210 degrees Celsius.

21. A method as claimed in claim 14, wherein said depositing step comprises the step of depositing indium-lead solder bumps.

22. A method as claimed in claim 21, wherein said plating step comprises the step of plating the plurality of solder pad locations with gold bearing material.

23. A method as claimed in claim 22, wherein said reflowing step occurs at a solder temperature in the range of approximately 174 degrees Celsius to 206 degrees Celsius.

24. A method of electrically and physically interconnecting an electronic device having a first surface to a circuit board having a second surface by plasma soldering, said method comprising the steps of:

depositing at least one solder bump on the first surface of the electronic device to form a solder bumped device;

preparing at least one solder pad location on the second surface of the circuit board;

putting the first and the second surfaces in contact with one another, such that the at least one solder bump contacts at least one corresponding solder pad location on the circuit board;

placing the electronic device including the at least one solder bump and the circuit board including the at least one corresponding solder pad location in a chamber;

evacuating the chamber to an absolute pressure of approximately 125 Pascal (approximately one Torr);

providing the plasma gas within the chamber;

exciting the plasma gas by energizing the plasma gas between a first electrode and a second electrode by applying a radio frequency (RF) energy source connected across the first electrode and the second electrode, said step of energizing the plasma gas producing an excited plasma species;

heating the electronic device and the circuit board with the plasma;

heating the at least one solder bump and the at least one corresponding solder pad location by heat conduction from the electronic device and the circuit board; and reflowing the at least one solder bump on the electronic device onto the at least one corresponding solder pad location on the circuit board to form at least one solder bond between the electronic device and the circuit board.

* * * * *